United States Patent
Inagaki et al.

(10) Patent No.: US 9,799,787 B2
(45) Date of Patent: Oct. 24, 2017

(54) SOLAR CELL, CONCENTRATOR PHOTOVOLTAIC UNIT, CONCENTRATOR PHOTOVOLTAIC MODULE, AND METHOD FOR PRODUCING CONCENTRATOR PHOTOVOLTAIC MODULE

(71) Applicant: Sumitomo Electric Industries, Ltd., Osaka-shi (JP)

(72) Inventors: Makoto Inagaki, Osaka (JP); Kenji Saito, Osaka (JP); Yoshiya Abiko, Osaka (JP); Koji Mori, Osaka (JP); Takashi Iwasaki, Osaka (JP); Yoshiki Kuhara, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/619,846

(22) Filed: Feb. 11, 2015

(65) Prior Publication Data
US 2015/0270418 A1 Sep. 24, 2015

(30) Foreign Application Priority Data
Mar. 24, 2014 (JP) .................. 2014-060624

(51) Int. Cl.
*H01L 31/042* (2014.01)
*H01L 31/054* (2014.01)
(Continued)

(52) U.S. Cl.
CPC .. *H01L 31/0543* (2014.12); *H01L 31/022433* (2013.01); *H01L 31/0475* (2014.12);
(Continued)

(58) Field of Classification Search
CPC ..... H01L 31/0547; H01L 31/0224–31/022433
(Continued)

(56) References Cited

U.S. PATENT DOCUMENTS

| 4,069,812 A | 1/1978 | O'Neill |
| 2008/0149161 A1* | 6/2008 | Nishida ........... H01L 31/022433 |
| | | 136/244 |

(Continued)

FOREIGN PATENT DOCUMENTS

| CN | 102714235 A | 10/2012 |
| JP | 6-104472 A | 4/1994 |

(Continued)

OTHER PUBLICATIONS

Office Action in Japanese Patent Application No. 2014-060624, dated Mar. 15, 2016.
(Continued)

*Primary Examiner* — Jeffrey T Barton
*Assistant Examiner* — Niki Bakhtiari
(74) *Attorney, Agent, or Firm* — Venable LLP; Michael A. Sartori; Laura G. Remus

(57) ABSTRACT

Provided is a solar cell for which accurate mutual alignment between a condenser lens and a power generating element corresponding thereto can be performed.
In a solar cell 23, a plurality of grid electrodes 31 each formed in a linear shape are arrayed on a light receiving surface 23a along the width direction of the light receiving surface 23a. The plurality of grid electrodes 31 include a first center grid electrode 31a forming a cross portion 34 exhibiting a center-specific geometry caused by electrodes crossing each other at the center of the light receiving surface 23a.

8 Claims, 13 Drawing Sheets

(51) Int. Cl.
*H01L 31/0224* (2006.01)
*H02S 40/22* (2014.01)
*H01L 31/18* (2006.01)
*H01L 31/0475* (2014.01)

(52) U.S. Cl.
CPC .............. *H01L 31/18* (2013.01); *H02S 40/22* (2014.12); *Y02E 10/52* (2013.01)

(58) Field of Classification Search
USPC ................................................ 136/243–265
See application file for complete search history.

(56) References Cited

U.S. PATENT DOCUMENTS

| | | | |
|---|---|---|---|
| 2009/0188554 A1* | 7/2009 | Aiken | ............. H01L 31/022433 136/256 |
| 2010/0170559 A1 | 7/2010 | McGlynn et al. | |
| 2010/0236603 A1 | 9/2010 | Menard et al. | |
| 2012/0048336 A1* | 3/2012 | Ito | ................... H01L 31/022425 136/244 |
| 2012/0291846 A1 | 11/2012 | Mikami et al. | |
| 2014/0230883 A1 | 8/2014 | Iwasaki et al. | |

FOREIGN PATENT DOCUMENTS

| | | |
|---|---|---|
| JP | 2013-080760 A | 5/2013 |
| JP | 3186623 U | 10/2013 |

OTHER PUBLICATIONS

Office Action in counterpart Japanese Patent Application No. 2014-060624, dated Nov. 8, 2016.
Office Action in co-pending U.S. Appl. No. 15/135,748, dated Mar. 20, 2017.

\* cited by examiner

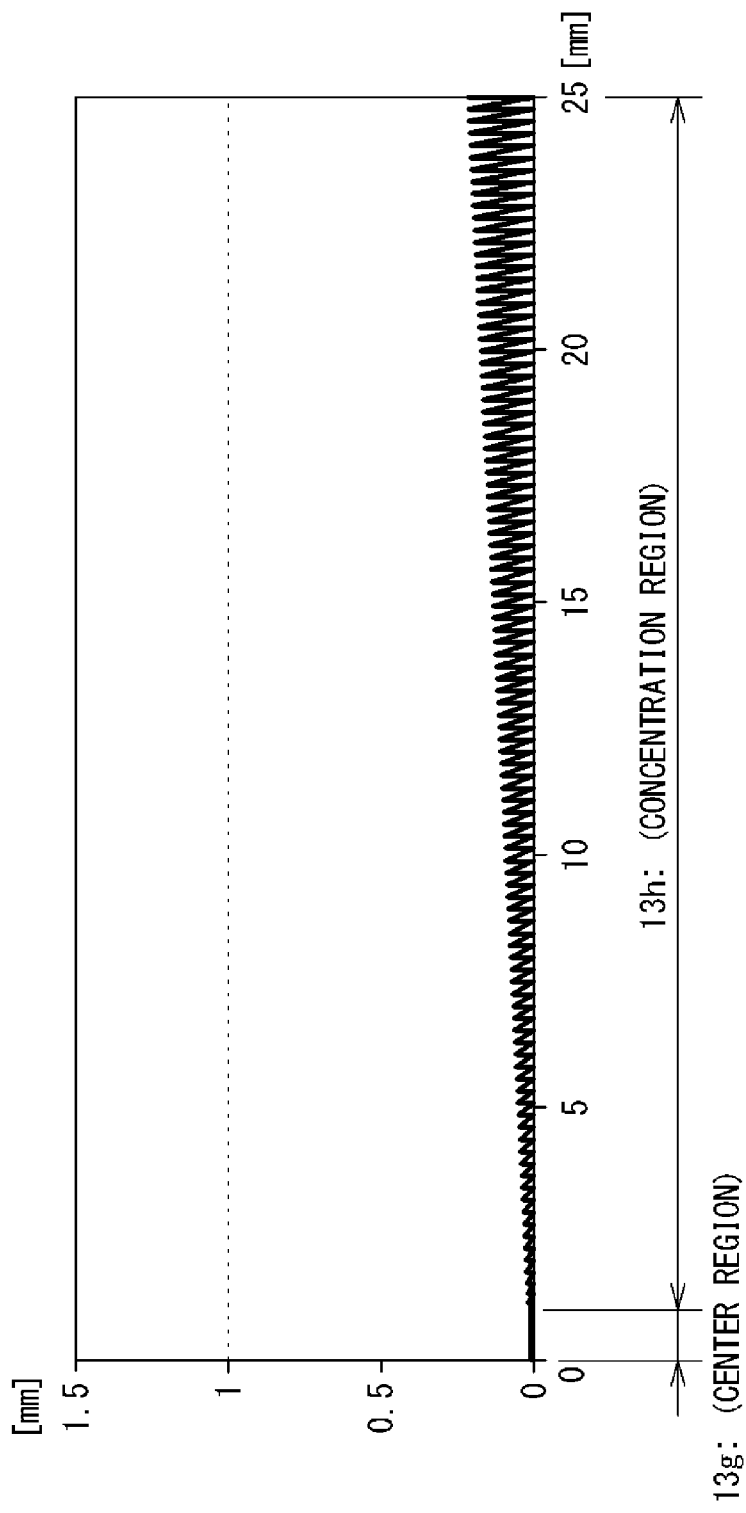

SOLAR CELL, CONCENTRATOR PHOTOVOLTAIC UNIT, CONCENTRATOR PHOTOVOLTAIC MODULE, AND METHOD FOR PRODUCING CONCENTRATOR PHOTOVOLTAIC MODULE

TECHNICAL FIELD

The present invention relates to a solar cell to be used in concentrator photovoltaic (CPV), a concentrator photovoltaic unit and a concentrator photovoltaic module each using the solar cell, and a method for producing the concentrator photovoltaic module.

BACKGROUND ART

Concentrator photovoltaic is based on a structure in which a solar cell formed by a small compound semiconductor element or the like having high power generation efficiency is irradiated with sunlight concentrated by a Fresnel lens (see PATENT LITERATURE 1, for example). A large number of such basic units are arranged in a matrix shape in one housing, thereby to form a concentrator photovoltaic module. A plurality of the modules are arranged, thereby to form a concentrator photovoltaic panel. By causing this concentrator photovoltaic panel to perform tracking operation so as to always face the sun, it is possible to obtain a desired generated power.

CITATION LIST

Patent Literature

PATENT LITERATURE 1: U.S. Pat. No. 4,069,812

SUMMARY OF INVENTION

Technical Problem

During production of the concentrator photovoltaic module as described above, it is necessary to perform alignment precisely such that, on the optical axis of each condenser lens such as a Fresnel lens, the center of its corresponding solar cell is positioned. Mutual alignment between solar cells and condenser lenses can be attained by ensuring their mounting accuracy relative to the common housing, for example. However, only doing this may allow minute individual differences, which may result in misalignment between the optical axis of each condenser lens and the center of its corresponding solar cell. If misalignment occurs, power generation efficiency is reduced.

In the basic unit above, as shown in FIG. 3, there are cases where between the solar cell and the condenser lens such as a Fresnel lens, a ball lens as a secondary condenser lens is disposed immediately before the light receiving surface of the solar cell, so as to cover the light receiving surface.

FIG. 13A shows the light receiving surface of the solar cell. A light receiving surface 200a of a solar cell 200 to be used in the concentrator photovoltaic module has a rectangular shape as shown, and one side of the rectangular shape is generally about several millimeters long.

In a case where the secondary condenser lens such as a ball lens is not provided, the center portion of the light receiving surface 200a can be recognized based on a contour 201 of the light receiving surface 200a.

However, when a ball lens is disposed immediately before the light receiving surface 200a of the solar cell, there are cases where the contour 201 cannot be recognized because the light receiving surface 200a is covered by the ball lens. Even when the light receiving surface 200a can be seen through the ball lens, only a part of grid electrodes 203 formed on the light receiving surface 200a can be confirmed, and the center of the light receiving surface 200a is difficult to be recognized.

FIG. 13B shows one example of a captured image of a ball lens as a secondary condenser lens, when the ball lens is disposed immediately before the light receiving surface 200a of the solar cell, the image captured by a camera or the like from the irradiation direction in which the ball lens is irradiated with sunlight.

In the captured image shown in FIG. 13B, there appear an image portion 302 of the ball lens and image portions 303 of only a part of the grid electrodes 203 confirmed through the ball lens in the image portion 302. The part corresponding to the contour of the light receiving surface 200a does not appear.

Thus, when the ball lens is disposed immediately before the light receiving surface 200a, it becomes difficult to recognize the center of the light receiving surface 200a. Thus, it becomes difficult to accurately align the optical axis of the ball lens with the center of the solar cell 200, whereby misalignment is caused. Due to this misalignment, further misalignment is caused also between the optical axis of the ball lens and the optical axis of the condenser lens, whereby power generation efficiency is reduced.

The present invention has been made in view of the above circumstances. An object of the present invention is to provide a technology that allows accurate mutual alignment between the condenser lens and its corresponding solar cell.

Solution to Problem

A solar cell being one embodiment is a solar cell in which a plurality of grid electrodes each formed in a linear shape are arrayed on a light receiving surface of the solar cell, wherein the plurality of grid electrodes include a cross grid electrode forming a cross portion exhibiting a center-specific geometry caused by electrodes crossing each other at a center of the light receiving surface.

A concentrator photovoltaic unit being one embodiment is a concentrator photovoltaic unit including: a solar cell in which a plurality of grid electrodes each formed in a linear shape are arrayed on a light receiving surface of the solar cell; and a condenser lens configured to concentrate sunlight on the solar cell, wherein the plurality of grid electrodes include a cross grid electrode forming a cross portion exhibiting a center-specific geometry caused by electrodes crossing each other at a center of the light receiving surface.

A concentrator photovoltaic module being one embodiment includes: a plurality of solar cells provided in a form of an array; and a concentrating member in which a plurality of condenser lenses each concentrating sunlight incident on an incident surface thereof are formed at positions corresponding to the solar cells on optical axes thereof, wherein on a light receiving surface of each solar cell, a plurality of grid electrodes each formed in a linear shape are arrayed, and the plurality of grid electrodes include a cross grid electrode forming a cross portion exhibiting a center-specific geometry caused by electrodes crossing each other at a center of the light receiving surface.

A method for producing a concentrator photovoltaic module being one embodiment is a method for producing a concentrator photovoltaic module including: a plurality of solar cells provided in a form of an array; and a concentrating member in which a plurality of condenser lenses each concentrating sunlight incident on an incident surface thereof are formed at positions corresponding to the solar cells on optical axes thereof, wherein on a light receiving surface of each solar cell, a plurality of grid electrodes each formed in a linear shape are arrayed, and the plurality of grid electrodes include a cross grid electrode forming a cross portion exhibiting a center-specific geometry caused by electrodes crossing each other at a center of the light receiving surface, the method including: a position information obtaining step of obtaining position information indicating positional relation between a condenser lens and a cross portion corresponding thereto at a time when the condenser lens and a solar cell corresponding thereto are seen from the incident surface side of the condenser lens; and an adjustment step of performing positional adjustment between the concentrating member and each solar cell based on the position information.

Advantageous Effects of Invention

According to the present invention, it is possible to perform accurate mutual alignment between the condenser lens and its corresponding solar cell.

BRIEF DESCRIPTION OF DRAWINGS

FIG. 9 is a graph showing one example of details of a Fresnel pattern.

FIG. 10A also shows a position of the Fresnel lens where a part of the ball lens of the power generating element part is seen at a not-aligned position.

DESCRIPTION OF EMBODIMENTS

Figure 1:
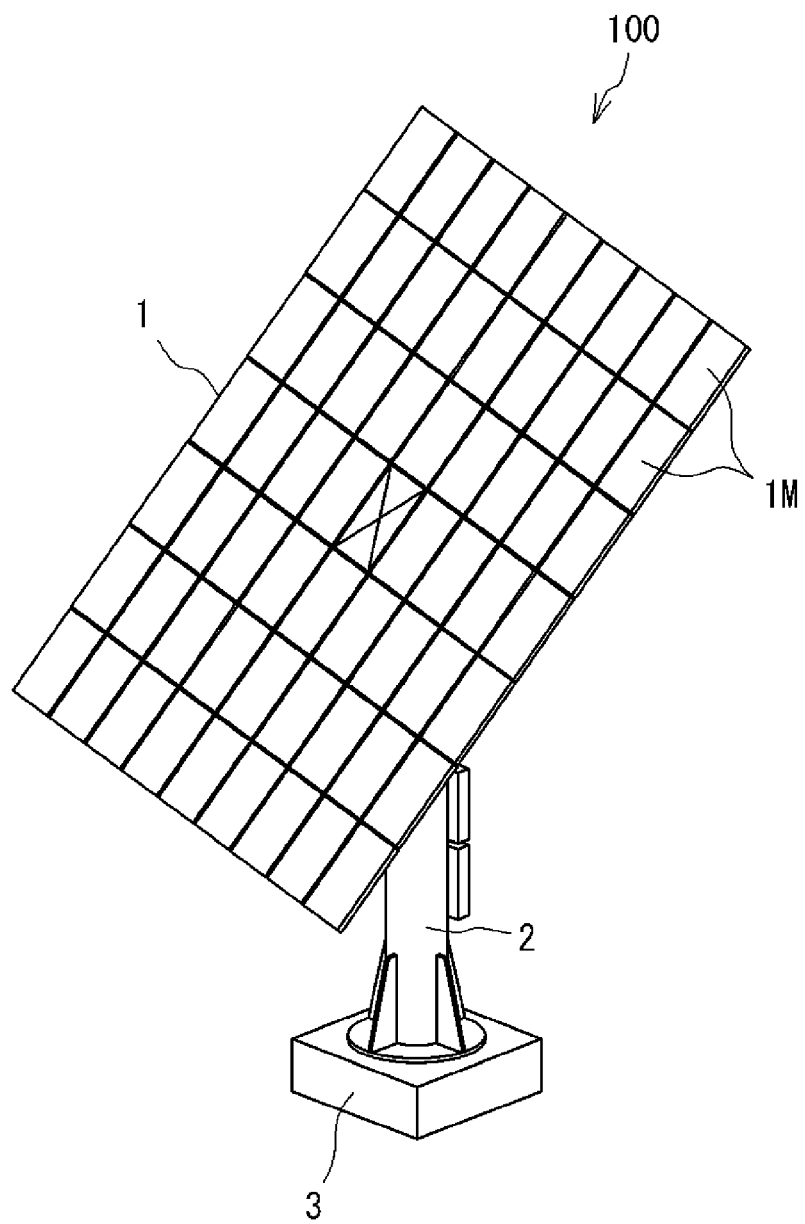
FIG. 1 is a perspective view showing one example of a concentrator photovoltaic apparatus.

[Description of Embodiments of the Present Invention]

First, contents of embodiments of the present invention will be listed for description.

(1) A solar cell being one embodiment is a solar cell in which a plurality of grid electrodes each formed in a linear shape are arrayed on a light receiving surface of the solar cell, wherein the plurality of grid electrodes include a cross grid electrode forming a cross portion exhibiting a center-specific geometry caused by electrodes crossing each other at a center of the light receiving surface.

According to the solar cell having the above configuration, the plurality of grid electrodes include the cross grid electrode forming the cross portion exhibiting the center-specific geometry caused by electrodes crossing each other at the center of the light receiving surface. Thus, when a condenser lens concentrating sunlight to the light receiving surface is to be disposed, the position of the cross portion can be recognized through the condenser lens. Thus, it is possible to accurately adjust the position of the optical axis of the condenser lens to the center of the light receiving surface, based on the positional relation between the condenser lens and the cross portion. As a result, it is possible to perform accurate mutual alignment between the condenser lens and its corresponding solar cell.

(2) In the above solar cell, preferably, the cross grid electrode is a center grid electrode extending in parallel to other grid electrodes and passing the center of the light receiving surface, and the center grid electrode is provided with a linear electrode portion crossing the center grid electrode at the center of the light receiving surface.

In this case, when the solar cell having the center grid electrode extending in parallel to other grid electrodes and passing the center of the light receiving surface is used, it is possible to form the cross portion only by providing the linear electrode portion. Accordingly, it is possible to provide the cross portion without greatly increasing the area of the grid electrodes.

(3) Further, preferably, the linear electrode portion has both ends thereof respectively connected to grid electrodes disposed on both sides of the center grid electrode. In this case, by the linear electrode portion being connected to the center grid electrode and to one pair of grid electrodes disposed on both sides of the center grid electrode, it is possible to suppress easy detachment of the linear electrode portion from the light receiving surface.

(4) The cross grid electrode may be a pair of center grid electrodes arrayed in a center portion in a width direction of the light receiving surface, each center grid electrode passing the center of the light receiving surface, and the pair of center grid electrodes may include: oblique electrode portions forming the cross portion by extending in directions that cross other grid electrodes and by crossing each other;

and parallel electrode portions each extending in parallel to the other grid electrodes, from both ends of a corresponding one of the oblique electrode portions toward edge sides of the light receiving surface.

In this case, even when the solar cell does not include the grid electrode extending in parallel to other grid electrodes and passing the center of the light receiving surface, by providing the pair of center grid electrodes including the oblique electrode portions, it is possible to form the cross portion. Accordingly, it is possible to provide the cross portion without greatly increasing the area of the grid electrodes.

(5) A concentrator photovoltaic unit being one embodiment is a concentrator photovoltaic unit including: a solar cell in which a plurality of grid electrodes each formed in a linear shape are arrayed on a light receiving surface of the solar cell; and a condenser lens configured to concentrate sunlight on the solar cell, wherein the plurality of grid electrodes include a cross grid electrode forming a cross portion exhibiting a center-specific geometry caused by electrodes crossing each other at a center of the light receiving surface.

According to the concentrator photovoltaic unit having the above configuration, the plurality of grid electrodes include the cross grid electrode forming the cross portion exhibiting the center-specific geometry caused by electrodes crossing each other at the center of the light receiving surface. Thus, when a condenser lens is to be disposed, the position of the cross portion can be recognized through the condenser lens. Thus, it is possible to accurately adjust the position of the optical axis of the condenser lens to the center of the light receiving surface, based on the positional relation between the condenser lens and the cross portion. As a result, it is possible to perform accurate mutual alignment between the condenser lens and its corresponding solar cell.

(6) The above concentrator photovoltaic unit may further include a secondary condenser lens disposed between the condenser lens and the solar cell and configured to guide sunlight concentrated by the condenser lens to the solar cell. Also in this case, based on the positional relation between each condenser lens and its corresponding cross portion, it is possible to accurately adjust the position of the optical axis of each condenser lens to the center of the light receiving surface. As a result, even when the secondary condenser lens is provided, it is possible to perform accurate mutual alignment between each condenser lens and its corresponding solar cell.

(7) Further, even when the secondary condenser lens is a ball lens and is fixed to the solar cell side so as to cover the light receiving surface of the solar cell, it is possible to recognize the position of the cross portion through each condenser lens. Thus, it is possible to perform accurate mutual alignment between each condenser lens and its corresponding solar cell.

(8) A concentrator photovoltaic module being one embodiment is a concentrator photovoltaic module including: a plurality of solar cells provided in a form of an array; and a concentrating member in which a plurality of condenser lenses each concentrating sunlight incident on an incident surface thereof are formed at positions corresponding to the solar cells on optical axes thereof, wherein on a light receiving surface of each solar cell, a plurality of grid electrodes each formed in a linear shape are arrayed, and the plurality of grid electrodes include a cross grid electrode forming a cross portion exhibiting a center-specific geometry caused by electrodes crossing each other at a center of the light receiving surface.

According to the concentrator photovoltaic module having the above configuration, the plurality of grid electrodes include the cross grid electrode forming the cross portion exhibiting the center-specific geometry caused by electrodes crossing each other at the center of the light receiving surface. Thus, when a condenser lens is to be disposed, the position of the cross portion can be recognized through the condenser lens. Thus, it is possible to accurately adjust the position of the optical axis of the condenser lens to the center of the light receiving surface, based on the positional relation between the condenser lens and the cross portion. As a result, it is possible to perform accurate mutual alignment between the concentrating member and each solar cell.

(9) A method for producing a concentrator photovoltaic module being one embodiment is a method for producing a concentrator photovoltaic module including: a plurality of solar cells provided in a form of an array; and a concentrating member in which a plurality of condenser lenses each concentrating sunlight incident on an incident surface thereof are formed at positions corresponding to the solar cells on optical axes thereof, wherein on a light receiving surface of each solar cell, a plurality of grid electrodes each formed in a linear shape are arrayed, and the plurality of grid electrodes include a cross grid electrode forming a cross portion exhibiting a center-specific geometry caused by electrodes crossing each other at a center of the light receiving surface, the method including: a position information obtaining step of obtaining position information indicating positional relation between a condenser lens and a cross portion corresponding thereto at a time when the condenser lens and a solar cell corresponding thereto are seen from the incident surface side of the condenser lens; and an adjustment step of performing positional adjustment between the concentrating member and each solar cell based on the position information.

According to the method for producing the concentrator photovoltaic module having the above configuration, it is possible to easily recognize the center of the light receiving surface by means of the cross portion formed on the light receiving surface of the solar cell, and it is possible to perform accurate mutual alignment between the concentrating member and each solar cell.

(10) In the method for producing the concentrator photovoltaic module, in a case where the concentrator photovoltaic module further includes a secondary condenser lens disposed between each condenser lens and a solar cell corresponding thereto, each secondary condenser lens guiding sunlight concentrated by the condenser lens to the solar cell, it is preferable that the method further includes: prior to the position information obtaining step, a secondary condenser lens position information obtaining step of obtaining secondary condenser lens position information indicating positional relation between a secondary condenser lens and the cross portion at a time when the secondary condenser lens and the solar cell are seen from an incident surface side of the secondary condenser lens; and a secondary condenser lens adjustment step of performing positional adjustment between the secondary condenser lens and the solar cell based on the secondary condenser lens position information.

In this case, it is possible to easily recognize the center of the light receiving surface by means of the cross portion formed on the light receiving surface of the solar cell, and thus, it is possible to perform accurate mutual alignment between the secondary condenser lens and the solar cell. In addition, the mutual alignment between the concentrating member and the solar cells to be performed thereafter can be more accurately performed by means of the cross portion.

DETAILED DESCRIPTION OF EMBODIMENTS OF THE PRESENT INVENTION

Hereinafter, preferable embodiments will be described with reference to the drawings.

1. CONFIGURATION OF CONCENTRATOR PHOTOVOLTAIC MODULE

FIG. 1 is a perspective view showing one example of a concentrator photovoltaic apparatus. In FIG. 1, a concentrator photovoltaic apparatus 100 includes a concentrator photovoltaic panel 1, a post 2 which supports the concentrator photovoltaic panel 1 on the rear surface side thereof, and a base 3 on which the post 2 is mounted.

The concentrator photovoltaic panel 1 is formed by assembling a large number of concentrator photovoltaic modules 1M vertically and horizontally. In this example, 62 (7 in length×9 in breadth−1) concentrator photovoltaic modules 1M are assembled vertically and horizontally, except the center portion. When one concentrator photovoltaic module 1M has a rated output of, for example, about 100 W, the entirety of the concentrator photovoltaic panel 1 has a rated output of about 6 kW.

On the rear surface side of the concentrator photovoltaic panel 1, a driving device (not shown) is provided. By operating this driving device, it is possible to cause the concentrator photovoltaic panel 1 to track the sun while always facing the direction of the sun.

Figure 2:
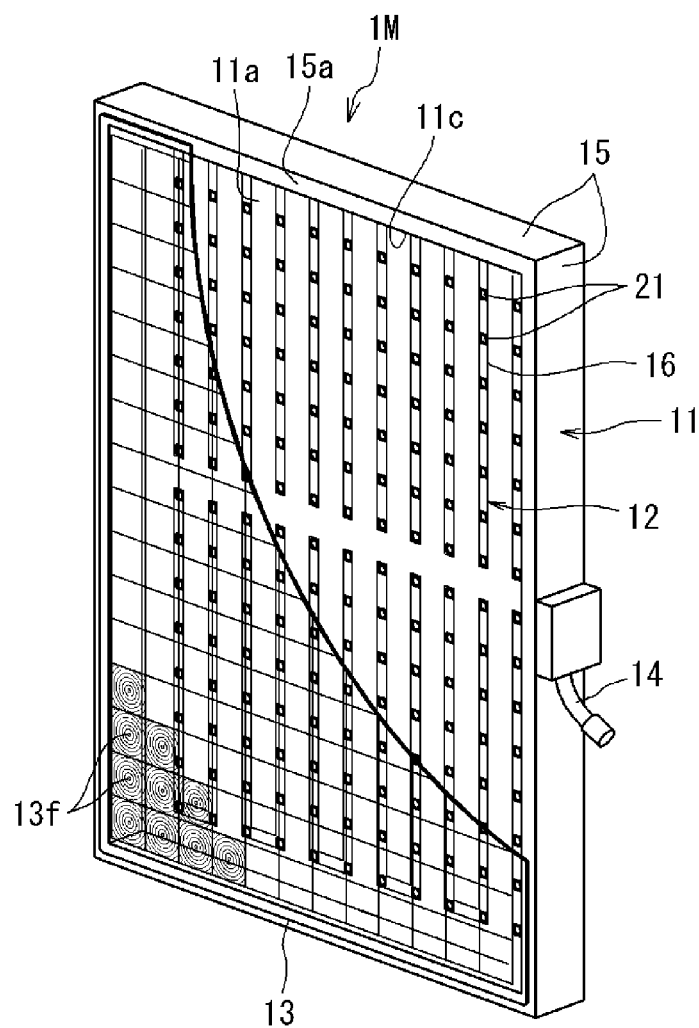
FIG. 2 is a perspective view (partially cut out) showing an enlarged view of one example of a concentrator photovoltaic module.

FIG. 2 is a perspective view (partially cut out) showing an enlarged view of one example of the concentrator photovoltaic module (hereinafter, also simply referred to as "module") 1M. Three directions orthogonal with one another are defined as X, Y, and Z, as shown in FIG. 2.

In FIG. 2, the module 1M includes: a housing 11 formed in a vessel shape and having a bottom surface 11a on an X-Y plane; a plurality of flexible printed circuits 12 provided on the bottom surface 11a; and a lens panel 13 (concentrating member) having a rectangular shape (shown in a state of being partially cut out), mounted on an end surface 15a of a wall part 15 standing from the periphery of the bottom surface 11a, and closing an opening 11c of the housing 11. The housing 11 is made of metal, for example, and an aluminium alloy which is excellent in thermal conductivity in particular is suitable therefor.

The lens panel 13 is a Fresnel lens array and is formed by arranging, in a matrix shape, a plurality of (for example, 16 in length×12 in breadth, 192 in total) Fresnel lenses 13f as lens elements which concentrate sunlight. Each Fresnel lens 13f forms a square effective concentration region. The lens panel 13 can be obtained by, for example, forming a silicone resin film on the back surface (inside) of a glass plate used as a base material. Each Fresnel lens 13f is formed on this silicone resin film. On the external surface of the housing 11, a connector 14 for taking out an output from the module 1M is provided.

Each flexible printed circuit 12 includes: a flexible substrate 16, of a ribbon shape, on which a necessary conduction pattern is provided; and a plurality of power generating element parts 21 provided on this flexible substrate 16. In the example shown in FIG. 2, each flexible printed circuit 12 has eight power generating element parts 21 mounted thereon. The flexible printed circuits 12 are arranged in a plurality of rows along the longitudinal direction of the housing 11, and 24 flexible printed circuits 12 are arranged in total. Thus, the total number of the power generating element parts 21 is 192 (24×8). That is, the number of the power generating element parts 21 is the same as the number of the Fresnel lenses 13f of the lens panel 13. Further, the power generating element parts 21 are provided on the optical axes of their corresponding Fresnel lenses 13f, respectively.

A Fresnel lens 13f and a power generating element part 21 provided so as to correspond to each other form a concentrator photovoltaic unit as an optical system basic unit for constructing the module 1M described above.

Figure 3:
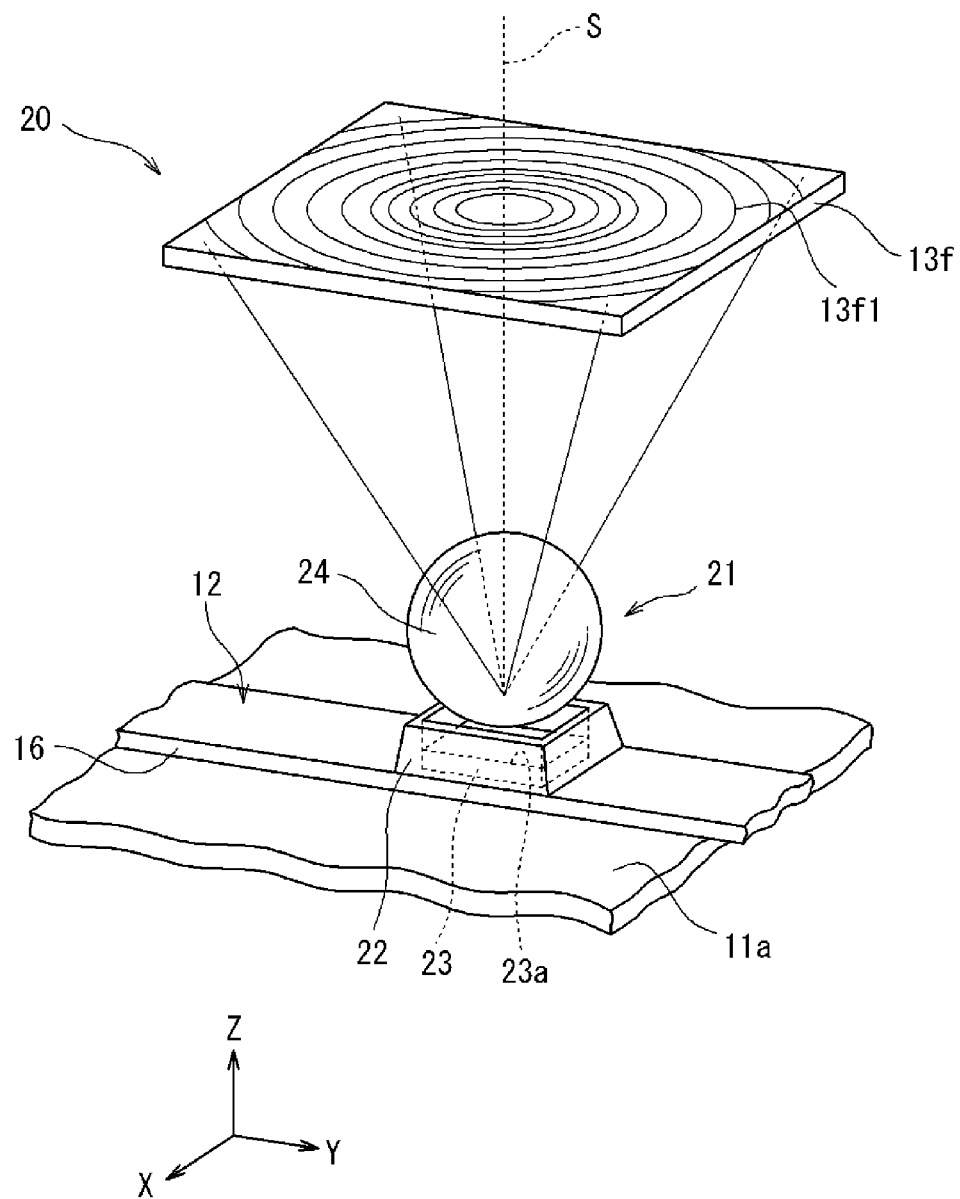
FIG. 3 is a schematic diagram showing a concentrator photovoltaic unit.

FIG. 3 is a schematic diagram showing the concentrator photovoltaic unit.

In FIG. 3, a photovoltaic unit (hereinafter, also simply referred to as "unit") 20 includes the Fresnel lens 13f and the power generating element part 21 as described above.

The Fresnel lens 13f concentrates sunlight incident from an incident surface 13f1, onto the power generating element part 21 provided so as to correspond thereto.

The power generating element part 21 includes a solar cell 23 being a power generating element, and a ball lens 24.

The solar cell 23 is packaged on the flexible substrate 16 by a resin frame 22 surrounding the solar cell 23, with a light receiving surface 23a thereof exposed.

The Fresnel lens 13f is disposed such that the optical axis S of the Fresnel lens 13f is parallel to the Z direction and such that the optical axis S passes the center of the light receiving surface 23a.

The ball lens 24 is disposed at a position at which the ball lens 24 can appropriately guide sunlight toward the light receiving surface 23a, by the center of the ball lens 24 being disposed on the optical axis S.

Figure 4:
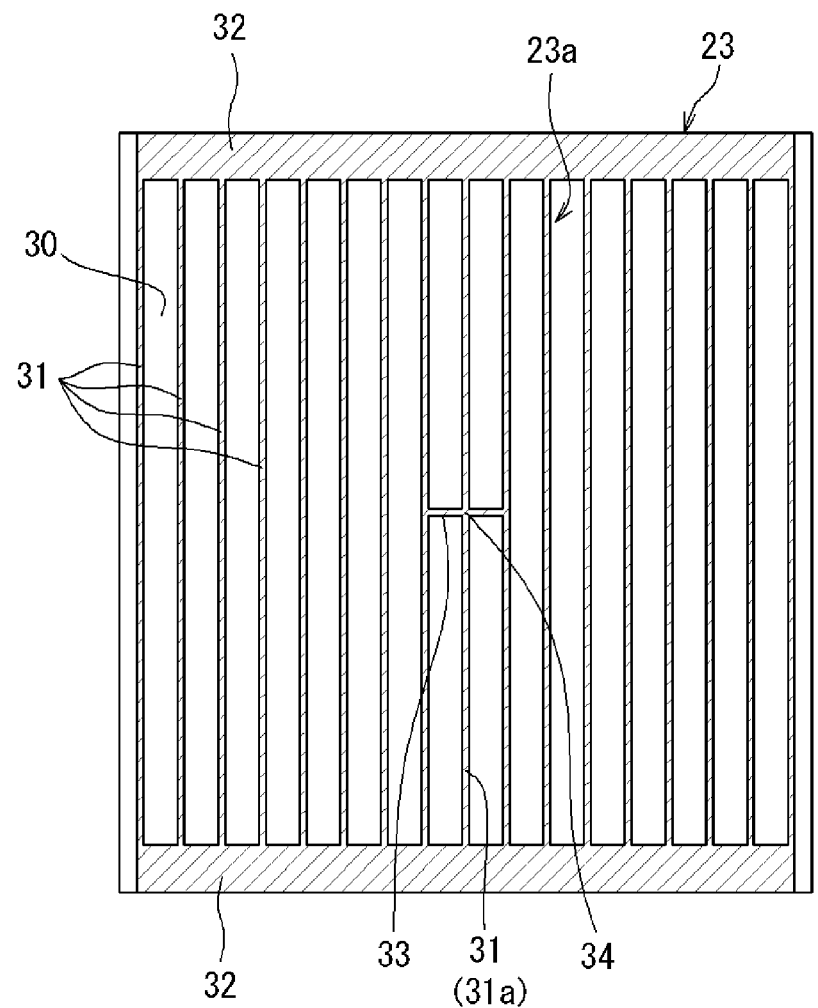
FIG. 4 shows a light receiving surface of a solar cell.

FIG. 4 shows the light receiving surface 23a of the solar cell 23.

The solar cell 23 includes: a semiconductor substrate 30 whose one face serves as the light receiving surface 23a having a rectangular shape; a plurality of linear grid electrodes 31 arrayed on the light receiving surface 23a; and a pair of bus electrodes 32 provided at edge portions of the semiconductor substrate 30 and respectively connected to both ends of each of these grid electrodes 31.

In FIG. 4, the portions with hatching indicate the places where the grid electrodes 31 and the bus electrodes 32 are provided, and the portions without hatching indicate the places where the semiconductor substrate 30 is exposed.

Each grid electrode 31 is an electrode formed by a conductor such as silver in a thin line shape, and has a function of collecting electric energy obtained by conversion of sunlight received by the semiconductor substrate 30.

Each bus electrodes 32 is an electrode formed by a conductor such as silver, as in the case of the grid electrode 31, and has a function of outputting electric energy collected by the grid electrodes 31, to outside. The bus electrodes 32 are respectively formed along both side edges, of the semiconductor substrate 30, that are parallel to the direction that crosses the longitudinal direction of the grid electrodes 31 on the semiconductor substrate 30.

The grid electrodes 31 extend in parallel to edge portions of the light receiving surface 23a where the bus electrodes 32 are not provided, and are arrayed, on the light receiving surface 23a, along the longitudinal direction of the bus electrodes 32.

These grid electrodes 31 include a first center grid electrode 31a passing the center of the light receiving surface 23a.

The first center grid electrode 31a extends in parallel to the other grid electrodes 31. This first center grid electrode 31a is provided with a linear electrode portion 33 which crosses the first center grid electrode 31a at the center of the light receiving surface 23a.

The linear electrode portion 33 is formed in parallel to the direction in which the bus electrodes 32 extend. Both ends of the linear electrode portion 33 are respectively connected to the grid electrodes 31 that are respectively disposed on both sides of the first center grid electrode 31a.

Accordingly, for example, when compared with a case where both ends of the linear electrode portion 33 are not connected to the grid electrodes 31 that are respectively disposed on both sides of the first center grid electrode 31a, i.e., the linear electrode portion 33 is in an open state, it is possible to suppress easy detachment of the linear electrode portion 33 from the light receiving surface 23a.

The first center grid electrode 31a forms a cross portion 34 by crossing the linear electrode portion 33 at the center of the light receiving surface 23a.

In the light receiving surface 23a of the present embodiment, there is no portion where electrodes cross each other, except the cross portion 34. The cross portion 34 exhibits a center-specific geometry, by the electrodes crossing each other at the center of the light receiving surface 23a.

In this manner, the first center grid electrode 31a constitutes a cross grid electrode in which the cross portion 34 is formed that exhibits a center-specific geometry caused by electrodes crossing each other at the center of the light receiving surface 23a. The cross portion 34 indicates the center of the light receiving surface 23a.

With reference back to FIG. 3, the ball lens 24 is a spherical lens formed by use of borosilicate-based glass or quartz-based glass, for example. The ball lens 24 is fixed to the resin frame 22 by being bonded with a silicone resin, an acrylic resin, or the like. Accordingly, the ball lens 24 is fixed to the solar cell 23, with a slight gap therebetween.

In general, the ball lens 24 that has a diameter greater than the dimensions of the light receiving surface 23a is used from the viewpoint of efficiency. Thus, as shown in FIG. 3, the ball lens 24 is fixed to the resin frame 22 on the flexible substrate 16 being the solar cell 23 side, so as to cover the entirety of the light receiving surface 23a of the solar cell 23.

The slight gap between the ball lens 24 and the solar cell 23 may be filled with the silicone resin, the acrylic resin, or the like that is used for the fixing by bonding as described above.

The ball lens 24 is disposed between the Fresnel lens 13f and the solar cell 23, so as to receive sunlight concentrated by the Fresnel lens 13f to guide the sunlight to the solar cell 23. That is, the Fresnel lens 13f forms a primary condenser lens, and the ball lens 24 forms a secondary condenser lens.

In this configuration, sunlight is concentrated by the Fresnel lens 13f being the primary condenser lens, then further concentrated by the ball lens 24 being the secondary condenser lens, to be emitted onto the solar cell 23. Therefore, a large amount of light energy can be concentrated on the solar cell 23, and thus, power can be generated at high efficiency.

The module 1M includes a plurality of units 20 which each can generate power at high efficiency as described above, and outputs power generated by each unit 20 from the connector 14 (FIG. 2).

2. METHOD FOR PRODUCING CONCENTRATOR PHOTOVOLTAIC MODULE

Next, of the method for producing the module 1M, a method for mounting the ball lens 24 on the flexible substrate 16 side, and alignment at the time of mounting the lens panel 13 of the module 1M onto the housing 11 will be described in particular.

[2.1 Method for Mounting the Ball Lens 24]

As described above, when the ball lens 24 is greatly misaligned from the light receiving surface 23a of the solar cell 23, power generation efficiency is reduced.

Thus, when each ball lens 24 is to be fixed to the housing 11, the ball lens 24 needs to be fixed after positional adjustment has been performed such that the optical axis of the ball lens 24 is accurately aligned with the light receiving surface 23a of the solar cell 23 corresponding to the ball lens 24.

Figure 5A:
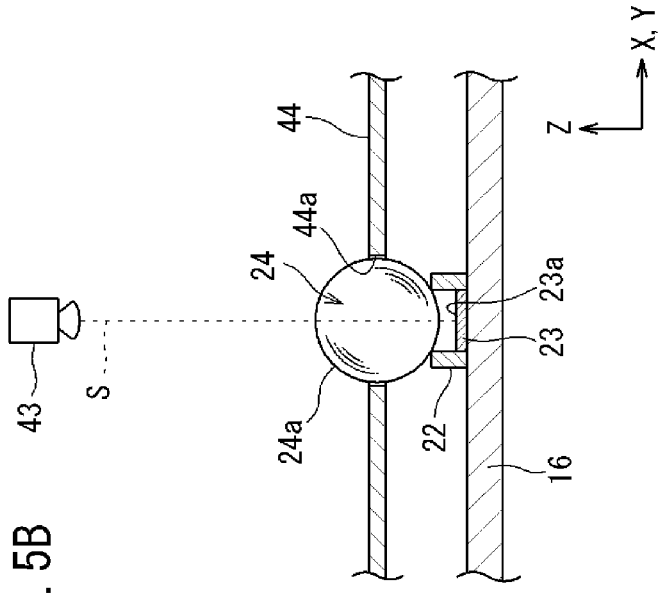
FIG. 5A shows a mounting device for mounting a ball lens onto the solar cell side, and a mounting method therefor, and shows the mounting device is disposed above the light receiving surface of the solar cell on a flexible substrate on which the ball lens is to be mounted.

FIG. 5A shows a mounting device for mounting the ball lens 24 onto the solar cell 23 side, and a mounting method therefor.

In FIG. 5A, a ball lens mounting device 40 for mounting the ball lens 24 includes: a positional adjustment section 41 capable of performing positional adjustment by moving the ball lens 24 while holding the ball lens 24 above the flexible substrate 16; a controller 42 configured to control the positional adjustment section 41; and a camera part 43 configured to capture an image of the ball lens 24 and the solar cell 23 side through the ball lens 24.

The positional adjustment section 41 includes a holder 44 configured to hold the ball lens 24 above the flexible substrate 16, and a drive unit 45 configured to drive the holder 44 based on an instruction from the controller 42. The holder 44 is configured to be able to move in X-Y directions while holding the ball lens 24 in a holding hole 44a. The holder 44 is driven by the drive unit 45, and performs positional adjustment between the ball lens 24 and the light receiving surface 23a of the solar cell 23 by moving the held ball lens 24 in X-Y directions.

The camera part 43 is configured to capture an image of a predetermined imaging range to generate captured image data, and configured to continuously provide the captured image data to the controller 42 at a predetermined time interval.

The camera part 43 is disposed such that the imaging direction at the time when the camera part 43 captures an image of a predetermined imaging range is parallel to the Z direction and such that the center of the imaging range matches the position on the X-Y coordinate system of the center of the light receiving surface 23a.

The camera part 43 disposed in this manner is configured to capture an image of the ball lens 24 and the light receiving surface 23a viewed through the ball lens 24, along the optical axis S of the Fresnel lens 13f to be disposed in a later step.

Upon receiving the captured image data from the camera part 43, the controller 42 obtains position information (ball lens position information) indicating the positional relation between the ball lens 24 and the light receiving surface 23a of the solar cell 23, based on the captured image. Then, the controller 42 generates an instruction for moving the ball lens 24 to an appropriate position based on this position information, and provides the instruction to the drive unit 45.

By use of the ball lens mounting device 40, the ball lens 24 is mounted on the solar cell 23 side as follows.

First, as shown in FIG. 5A, the ball lens mounting device 40 is disposed above the light receiving surface 23a of the solar cell 23 on the flexible substrate 16 on which the ball lens 24 is to be mounted.

Figure 5C:
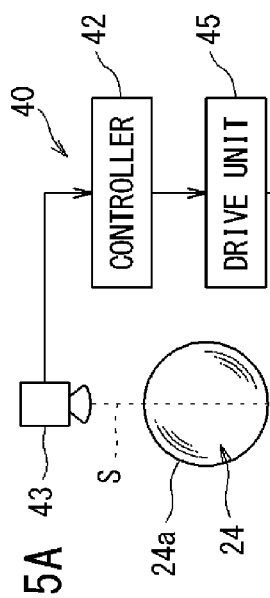
FIG. 5C shows the holder is removed.
Figure 5B:
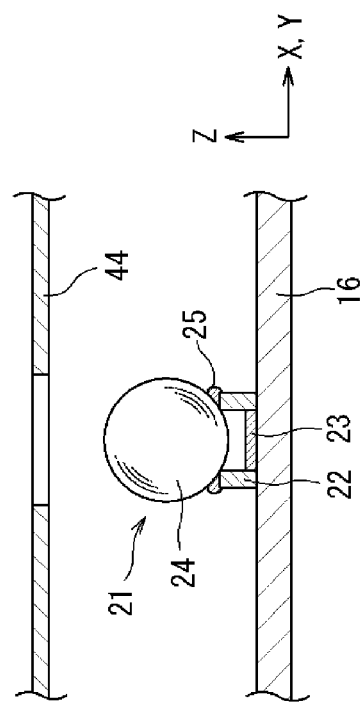
FIG. 5B shows the ball lens is inserted in a holding hole of a holder.

Next, as shown in FIG. 5B, the ball lens 24 is inserted in the holding hole 44a of the holder 44. The holding hole 44a is configured to hold the ball lens 24 so as to allow the ball lens 24 to be moved in X-Y directions, and configured to allow the ball lens 24 to be easily removed therefrom.

Thus, by being inserted in the holding hole 44*a*, the ball lens 24 is movably held therein.

As shown in FIG. 5B, the ball lens 24 is disposed on the resin frame 22 while being held in the holding hole 44*a*.

In the state of FIG. 5B, the camera part 43 captures an image of the ball lens 24 and the light receiving surface 23*a* recognized through the ball lens 24, in parallel to the optical axis S, from an incident surface 24*a* side of the ball lens 24.

Figure 6:
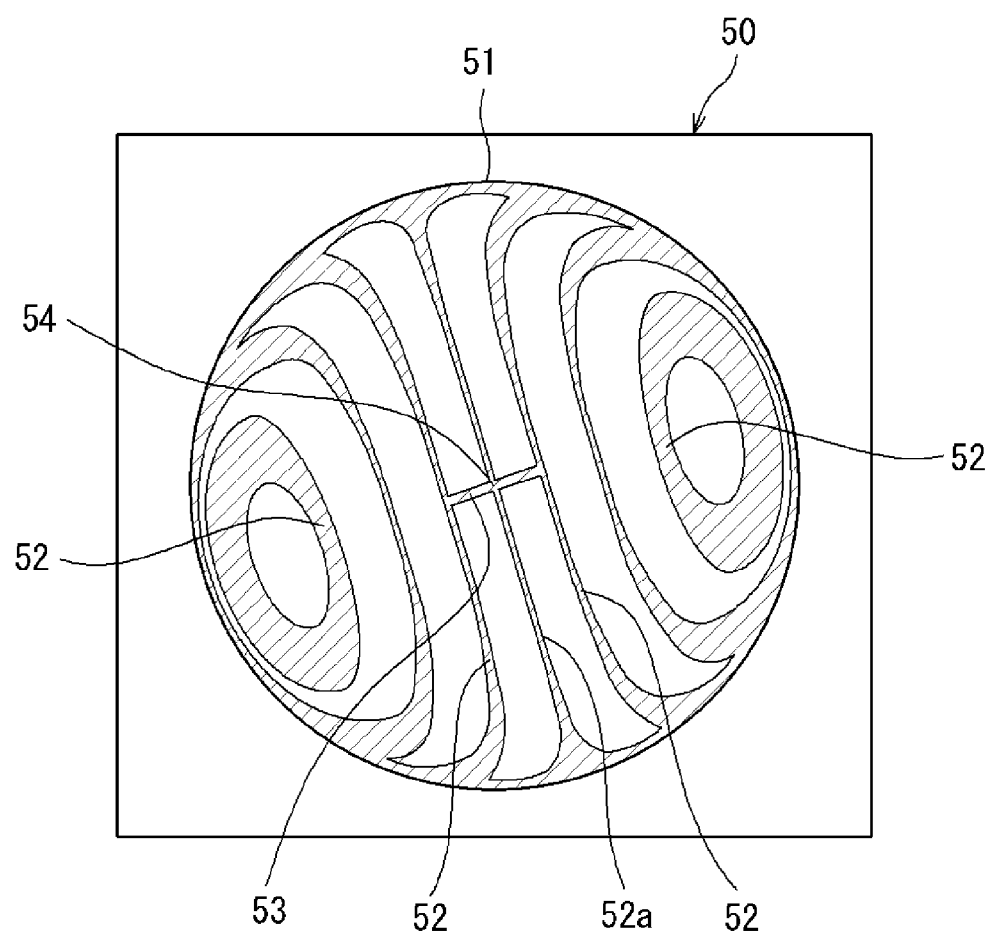
FIG. 6 shows one example of a captured image obtained by a camera part in a state of FIG. 5B.

FIG. 6 shows one example of the captured image obtained by the camera part 43 in the state of FIG. 5B.

Since the diameter of the ball lens 24 is set to a greater value than the values of the dimensions of the light receiving surface 23*a* of the solar cell 23, the entirety of the light receiving surface 23*a* is covered by the ball lens 24. Thus, the contour of the light receiving surface 23*a* cannot be recognized on a captured image 50.

On the other hand, the grid electrodes 31 formed on the light receiving surface 23*a* can be recognized through the ball lens 24. As shown in FIG. 6, in the captured image 50, an image portion 51 of the ball lens 24 appears, and many image portions 52 of the grid electrodes 31 that can be recognized through the ball lens 24 appear in the image portion 51 of the ball lens 24. In FIG. 6, the portions with hatching indicate the image portions 52 of the grid electrodes 31.

Since the ball lens 24 has a spherical shape, the incident surface 24*a* also has a round surface being a part of the spherical shape. Thus, in the images of the grid electrodes 31 recognized through the ball lens 24 when the ball lens 24 is seen in parallel to the optical axis S, distortion occurs due to the curvature of the incident surface 24*a*, in accordance with the increase in the distance from the center portion of the ball lens 24. Thus, as shown in FIG. 6, the image portions 52 of the grid electrodes 31 appearing in the image portion 51 of the ball lens 24 are distorted to an extent that the linearity of the grid electrodes 31 cannot be recognized, in accordance with the increase in the distance from the center portion of the ball lens 24.

However, the image portions 52 of the grid electrodes 31 in the center portion of the image portion 51 of the ball lens 24 appear relatively clear to an extent that the linearity of the grid electrodes 31 can be recognized. Thus, it is seen that the grid electrodes 31 can be relatively clearly recognized in the center portion the ball lens 24.

Here, in the center portion of the image portion 51 of the ball lens 24 shown in FIG. 6, there appear an image portion 52*a* of the first center grid electrode 31*a* passing the center of the light receiving surface 23*a*, and an image portion 53 of the linear electrode portion 33 forming the cross portion 34 with the first center grid electrode 31*a*.

In this manner, in the center portion of the ball lens 24, the shapes of the grid electrodes 31 can be recognized.

Thus, by adjusting the position of the ball lens 24 such that the cross portion 34 formed by the first center grid electrode 31*a* and the linear electrode portion 33 substantially matches the center of the contour of the ball lens 24, the ball lens 24 can be accurately disposed on the optical axis S.

That is, when the position of the ball lens 24 is adjusted such that, in the captured image 50 obtained by the camera part 43, an image portion 54 of the cross portion 34 is positioned at the center of the contour of the image portion 51 of the ball lens 24, the center being specified based on the contour of the image portion 51, the center of the ball lens 24 can be accurately disposed so as to be on the optical axis S.

Thus, upon receiving the captured image data from the camera part 43, the controller 42 specifies the contour of the image portion 51 of the ball lens 24 and the image portion 54 of the cross portion 34 based on the captured image 50, and then obtains ball lens position information indicating the positional relation between the ball lens 24 and the cross portion 34 of the solar cell 23 (secondary condenser lens position information obtaining step).

Further, based on the ball lens position information, the controller 42 obtains a movement amount necessary for bringing the cross portion 34 to the center of the contour of the ball lens 24. The controller 42 provides this movement amount as an instruction to the drive unit 45.

In accordance with the movement amount provided by the controller 42, the drive unit 45 moves the holder 44 to adjust the position of the ball lens 24 (secondary condenser lens adjustment step).

In this manner, the controller 42 repeats obtainment of the ball lens position information and positional adjustment of the ball lens 24 based on the ball lens position information, thereby to dispose the ball lens 24 at an appropriate position.

In the present embodiment, a case has been described in which the controller 42 provides the drive unit 45 with a movement amount necessary for bringing the cross portion 34 to the center of the contour of the ball lens 24. However, for example, the controller 42 may provide display of the movement amount to an operator of the ball lens mounting device 40, and the operator having confirmed the display may operate the positional adjustment section 41 based on the movement amount, to adjust the position of the ball lens 24.

In the above, a case has been described in which the ball lens mounting device 40 is configured to perform adjustment by moving the ball lens 24 relative to the light receiving surface 23*a*. However, the ball lens 24 may be fixed, and the ball lens mounting device 40 may perform adjustment by moving the solar cell 23 side relative to the fixed ball lens 24.

As shown in FIG. 5C, when the positional adjustment of the ball lens 24 is completed, in order to fix the ball lens 24 at that position, a resin 25 for fixing by bonding is attached to the boundary portion between the ball lens 24 and the resin frame 22, and the ball lens 24 and the resin frame 22 are bonded and fixed together.

When bonding and fixing the ball lens 24 and the resin frame 22 together have been completed, and the holder 44 is removed, mounting of the ball lens 24 is completed.

The controller 42 may be configured by a computer including a CPU, a storage device, and the like, in which the functions as the controller 42 are realized by a computer program. In the storage device, the computer program for realizing the functions as the controller 42 is also stored.

This computer program is a computer program for causing a computer to execute a process regarding production of a concentrator photovoltaic module including:

a plurality of solar cells provided in a form of an array; and a concentrating member in which a plurality of condenser lenses each concentrating sunlight incident on an incident surface thereof are formed at positions corresponding to the solar cells on optical axes thereof, wherein on a light receiving surface of each solar cell, a plurality of grid electrodes each formed in a linear shape are arrayed, and the plurality of grid electrodes include a cross grid electrode forming a cross portion exhibiting a center-specific geometry caused by electrodes crossing each other at the center of the light receiving surface, the computer program for causing the computer to execute:

prior to a position information obtaining step of obtaining position information indicating positional relation between a condenser lens and a cross portion corresponding thereto at a time when the condenser lens and a solar cell corresponding thereto are seen from the incident surface side of the condenser lens, a secondary condenser lens position information obtaining step of obtaining secondary condenser lens position information indicating positional relation between a secondary condenser lens (the ball lens 24) and the cross portion at a time when the solar cell and the secondary condenser lens are seen from an incident surface side of the secondary condenser lens; and a secondary condenser lens adjustment step of performing positional adjustment between the secondary condenser lens and the solar cell based on the secondary condenser lens position information.

[2.2 Alignment of the Lens Panel 13]

As described above, each power generating element part 21 (solar cell 23) is provided on the optical axis S of its corresponding Fresnel lens 13f. If the power generating element part 21 is greatly misaligned from the optical axis of the Fresnel lens 13f, power generation efficiency is reduced.

Therefore, when the lens panel 13 is to be fixed to the housing 11, it is necessary to perform positional adjustment such that the optical axis of each Fresnel lens 13f of the lens panel 13 is accurately aligned with its corresponding power generating element part 21 provided in the housing 11.

Figure 7:
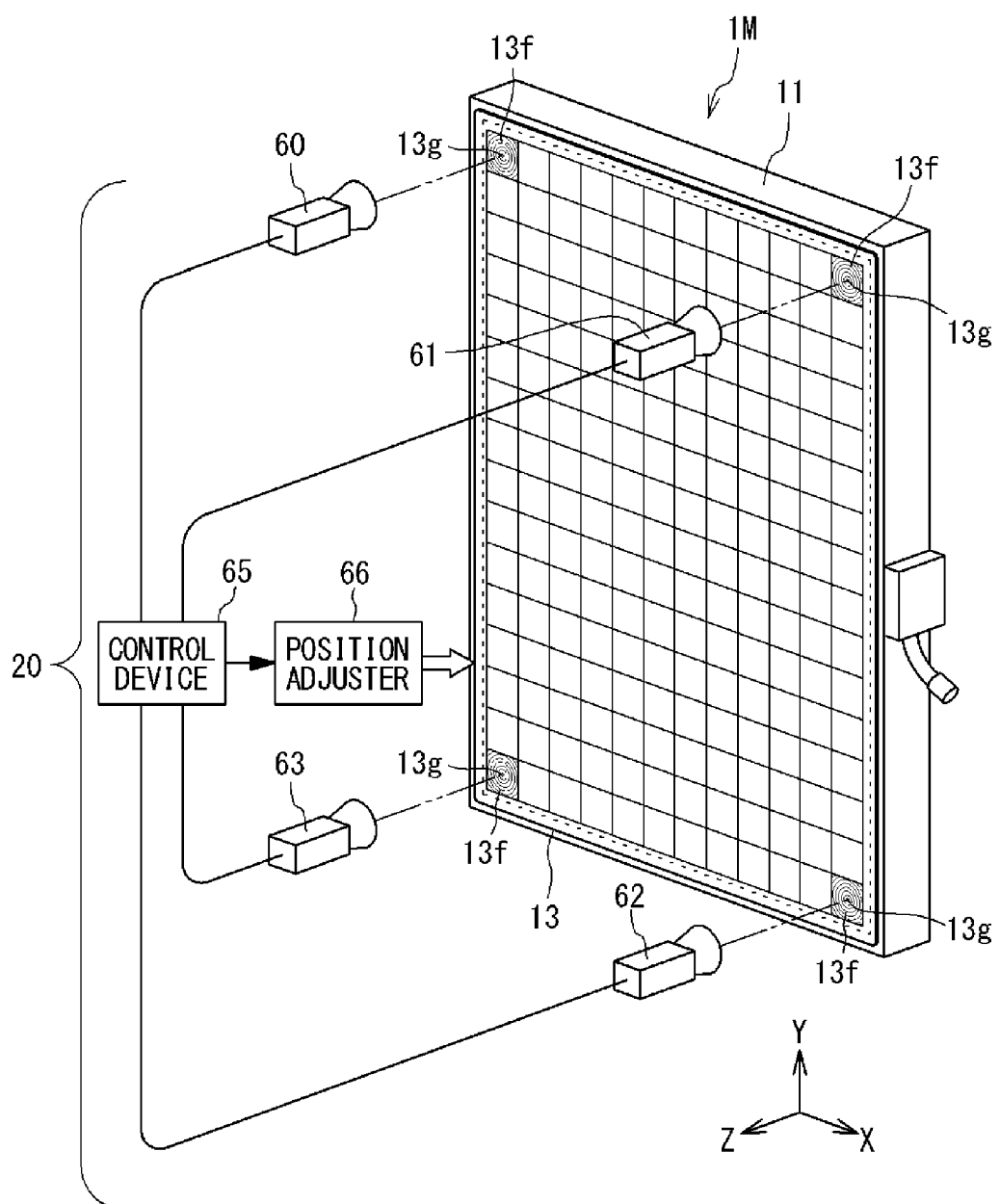
FIG. 7 is a perspective view showing one example of the manner of performing positioning when a lens panel is to be mounted on a housing.

FIG. 7 is a perspective view showing one example of the manner of performing positioning when the lens panel 13 is to be mounted on the housing 11. In FIG. 7, three directions orthogonal with one another are defined as X, Y, and Z, as shown.

For example, four cameras 60 to 63 are prepared as image capturing devices, and the cameras 60 to 63 respectively capture, through Fresnel lenses 13f at four corners of the lens panel 13, images of the power generating element parts 21 at their corresponding positions. The positions on the X-Y coordinate system of the cameras 60 to 63 match the positions of their corresponding power generating element parts 21 at the four corners. Therefore, each of the cameras 60 to 63 captures an image at a time when its corresponding Fresnel lens 13f and power generating element part 21 are seen along the optical axis S of the Fresnel lens 13f from the incident surface 13/1 side of the Fresnel lens 13f.

Data of the captured images obtained by the cameras 60 to 63 are provided to a control device 65.

The control device 65 is a device, such as a personal computer, that performs image information processing. Based on the captured image data provided from the cameras 60 to 63, the control device 65 obtains position information indicating the positional relations between the Fresnel lenses 13f and the power generating element parts 21.

Based on the obtained position information, the control device 65 causes a position adjuster 66 to operate so as to move the lens panel 13 to an appropriate position, whereby the control device 65 performs positional adjustment between the lens panel 13 and the power generating element parts 21. The position adjuster 66 can move the lens panel 13 in X-Y directions and also can slightly rotate the lens panel 13 on an X-Y plane.

Figure 8A:
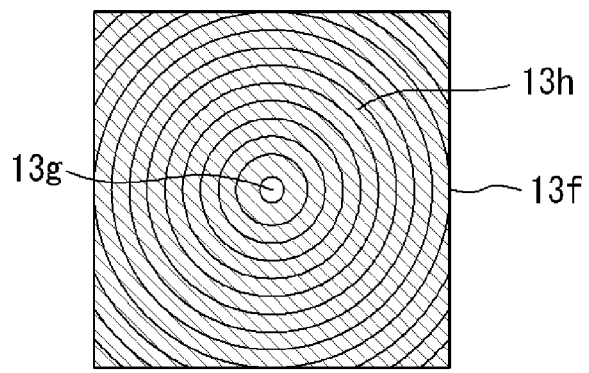
FIG. 8A is a front view of a Fresnel lens.
Figure 8B:
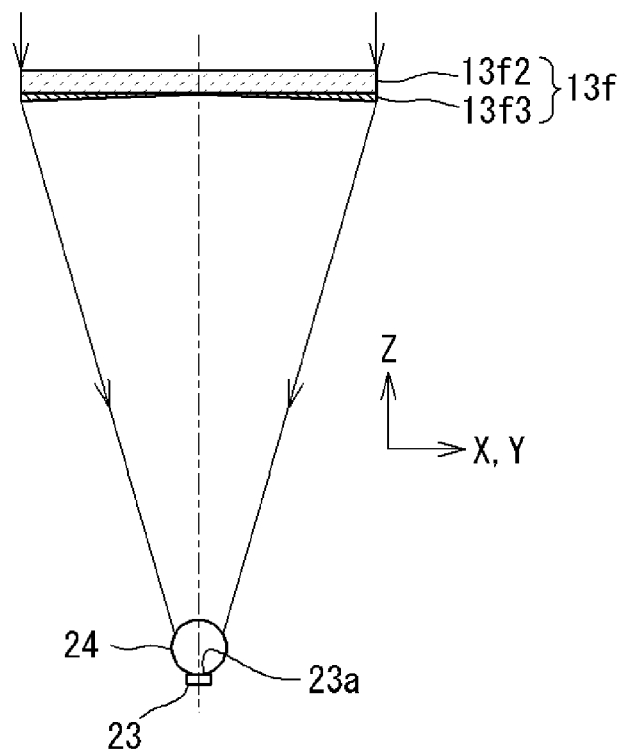
FIG. 8B shows positional relation between a Fresnel lens and a power generating element part of one unit.
Figure 8C:
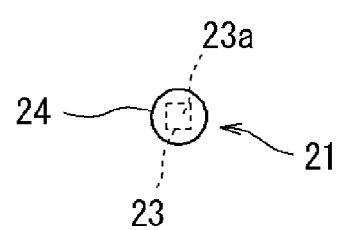
FIG. 8C is a front view of the power generating element part.

FIG. 8B shows positional relation between the Fresnel lens 13f and the power generating element part 21 of one unit. It should be noted that the dimensions of each part are not necessarily uniformly to scale. FIG. 8A is a front view of the Fresnel lens 13f, and FIG. 8C is a front view of the power generating element part 21.

For example, the Fresnel lens 13f is formed in a square shape having one side of 50 mm, the light receiving surface 23a of the solar cell 23 of the power generating element part 21 is formed in a square shape having one side of 3.5 mm, and the ball lens 24 is disposed immediately before the light receiving surface 23a. As described above, the Fresnel lens 13f is composed of a base material 13/2 being a glass plate, and a silicone resin film 13/3 being the lens body.

Sunlight concentrated by the Fresnel lens 13f is incident on the power generating element part 21.

As shown in FIG. 8A, the Fresnel lens 13f (the silicone resin film 13/3) has a concentric Fresnel pattern formed therein. In the center portion of the Fresnel lens 13f, a center region 13g without the Fresnel pattern is formed. The center region 13g, unlike a concentration region 13h (portion with diagonal lines) therearound, does not contribute to concentration of light but allows light to pass therethrough. The diameter of the center region 13g is about 2 mm, for example.

FIG. 9 is a graph showing one example of the details of the Fresnel pattern. The horizontal axis represents the radius [mm] from the center, and the vertical axis represents the projection amount [mm] from the base material 13/2. As shown in FIG. 9, the further out in the radial direction, the greater the projection amount is (the difference between the top of the projection and the bottom of the recess increases). Due to such a pattern shape, light concentrating property similar to that of a convex lens can be obtained. The center region 13g at the center portion does not contribute to concentration of light but allows light to pass therethrough.

By affixing the Fresnel pattern formed in the silicone resin film 13/3 to the base material 13/2, due to factors such as contraction of the adhesive and temperature change, the center region 13g, originally flat, is pulled outwardly to have a shape that is thinnest at the center and thicker toward outside in a concave lens shape. Since this center region 13g does not have the Fresnel pattern, the power generating element part 21 can be seen through the center region 13g by the camera 60 to 63.

That is, when the power generating element part 21 is to be viewed by a camera or the eye through the other portion (i.e., the concentration region 13h) of the Fresnel lens 13f than the center region 13g, the view becomes blurry or the image is distorted, and thus, the power generating element part 21 may not be clearly seen. However, through the center region 13g serving as a concave lens, the power generating element part 21 can be clearly seen.

Thus, by viewing the power generating element part 21 through the small center region 13g at the center portion of the Fresnel lens 13f, it is possible to perform alignment between the power generating element part 21 and its corresponding Fresnel lens 13f.

It is inefficient to perform alignment between all the power generating element parts 21 and their corresponding Fresnel lenses 13f. Thus, for example, alignment is performed on the power generating element parts 21 at four corners and their corresponding Fresnel lenses 13f at the four corners. Accordingly, highly accurate and quick alignment can be performed.

Basically, however, by positioning the lens panel 13 such that, with respect to each of at least two (two at positions distanced from each other as much as possible) Fresnel lenses 13f, the power generating element part 21 comes to the center of the field of view, it is possible to easily realize the alignment between Fresnel lenses versus power generating element parts in the entirety of the lens panel 13. This is because both the power generating element parts 21 and the Fresnel lenses 13f are provided in the form of an array, and if alignment is performed in a portion thereof, the effect of the alignment is also applied to the entirety thereof.

FIG. 10 shows one example the manner of performing the alignment between a Fresnel lens versus a power generating element part.

As described above, the light receiving surface 23a is covered by the ball lens 24, and thus, in the center region 13g, the ball lens 24 can be confirmed.

In addition, as described above, in the center portion of the ball lens 24, the grid electrodes 31 can be recognized relatively clearly.

In the present embodiment, the ball lens 24 is fixed after the position of its center has been adjusted so as to be aligned with the optical axis S of the Fresnel lens 13f, the optical axis S being aligned with the center of the light receiving surface 23a.

Therefore, when the center region 13g is viewed by the camera 60 to 63, the ball lens 24 can be seen, and at the same time, in the center portion of the ball lens 24, the linear electrode portion 33 crossing the first center grid electrode 31a, and the cross portion 34 can be seen.

Figure 10A:
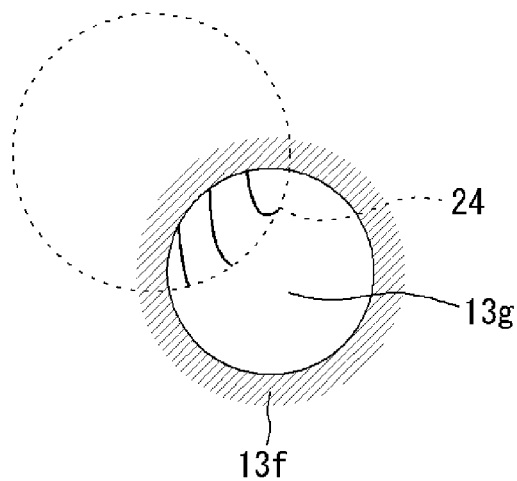
FIG. 10A shows a power generating element part viewed from the center region of a Fresnel lens.
Figure 10B:
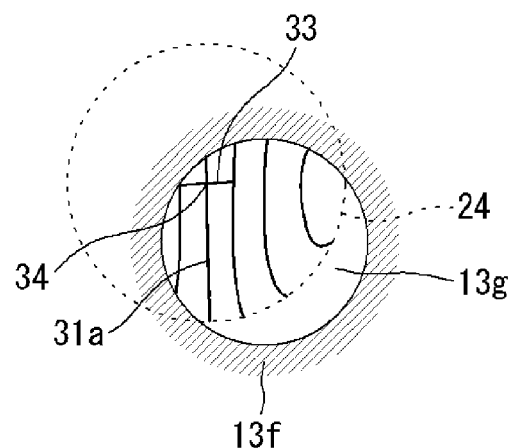
FIG. 10B shows a state where a linear electrode portion and a cross portion appear in the center region.
Figure 10C:
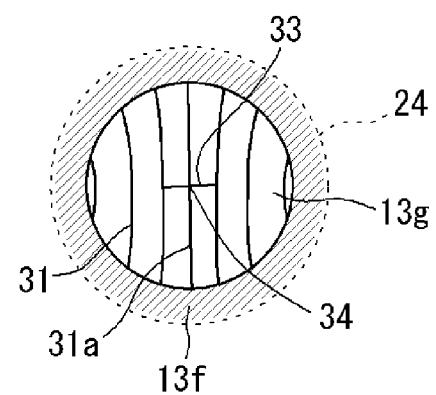
FIG. 10C shows a state where the cross portion has come to substantially the center of the center region.

The control device 65 performs fine adjustment of the position of the lens panel 13, from the position of FIG. 10A where a part of the ball lens 24 of the power generating element part 21 is seen at a not-aligned position, to a position where the ball lens 24 can be seen at the center. Then, after a state is realized where the linear electrode portion 33 and the cross portion 34 appear in the center region 13g as shown in FIG. 10B, and then a state is realized where the cross portion 34 has come to substantially the center of the center region 13g as shown in FIG. 10C, alignment for this power generating element part 21 is completed. In this manner, when the cross portions 34 recognized at the power generating element parts 21 at the four corners can be seen through the center regions 13g in the center portions of the respective Fresnel lenses 13f by the four cameras 60 to 63 at the respective centers, alignment is completed.

Each of the cameras 60 to 63 outputs the states recognized as above, as captured image data. Based on the captured image data indicating the states as above and provided from each of the cameras 60 to 63, the control device 65 obtains position information indicating the positional relation between the Fresnel lens 13f and the cross portion 34.

Based on the obtained position information, the control device 65 further obtains a movement amount for moving the lens panel 13 to an appropriate position, and controls the position adjuster 66 based on this movement amount.

It should be noted that performing alignment at the four corners of the lens panel 13 is merely one example, and variations thereof can be conceivable. Basically, as described above, alignment can be performed at two positions (for example, both ends on a diagonal line) that are distanced from each other as much as possible. That is, by positioning the lens panel 13 such that, with respect to each of at least two Fresnel lenses 13f, the power generating element part 21 comes to the center of the field of view, it is possible to easily realize alignment between Fresnel lenses 13f versus power generating element parts 21 in the entirety of the lens panel 13.

The center region 13g may be provided to all of the Fresnel lenses 13f, or may be provided to only some of the Fresnel lenses 13f that are to be used in the alignment.

In the present embodiment, a case has been described in which each power generating element part 21 includes the ball lens 24. However, even in a case where the power generating element part 21 does not include the ball lens 24 and the light receiving surface 23a is exposed, each of the cameras 60 to 63 can confirm the cross portion 34 formed on the light receiving surface 23a of its corresponding power generating element part 21. Thus, positional adjustment of the lens panel 13 by the above-described method can be performed.

The control device 65 may be configured by a computer including a CPU, a storage device, and the like. In this case, the functions as the control device 65 are realized by a computer program. In the storage device, the computer program for realizing the functions as the control device 65 is also stored.

This computer program is a computer program for causing a computer to execute a process regarding production of a concentrator photovoltaic module including:

a plurality of solar cells provided in a form of an array; and a concentrating member in which a plurality of condenser lenses each concentrating sunlight incident on an incident surface thereof are formed at positions corresponding to the solar cells on optical axes thereof, wherein on a light receiving surface of each solar cell, a plurality of grid electrodes each formed in a linear shape are arrayed, and the plurality of grid electrodes include a cross grid electrode forming a cross portion exhibiting a center-specific geometry caused by electrodes crossing each other at the center of the light receiving surface, the computer program for causing the computer to execute:

a position information obtaining step of obtaining position information indicating positional relation between a condenser lens and a cross portion corresponding thereto at a time when the condenser lens and a solar cell corresponding thereto are seen from the incident surface side of the condenser lens; and an adjustment step of performing positional adjustment between the concentrating member and each solar cell based on the position information.

3. EFFECTS

According to the solar cell 23 of the present embodiment, a plurality of grid electrodes 31 each formed in a linear shape are arrayed on the light receiving surface 23a. In addition, the plurality of grid electrodes 31 include the first center grid electrode 31a as a cross grid electrode forming the cross portion 34 exhibiting a center-specific geometry caused by electrodes crossing each other at the center of the light receiving surface 23a. Thus, in a case where condenser lenses such as the Fresnel lens 13f and the ball lens 24 which concentrate sunlight toward the light receiving surface 23a are to be disposed, the position of the cross portion 34 can be recognized through the condenser lenses. Thus, based on the positional relation between the condenser lenses and the cross portion 34, it is possible to accurately adjust the position of the optical axis of each of the condenser lenses to the center of the light receiving surface 23a. As a result, it is possible to perform accurate mutual alignment between the condenser lenses and their corresponding solar cell 23.

In the present embodiment, the first center grid electrode 31*a* is provided with the linear electrode portion 33 crossing the first center grid electrode 31*a* at the center of the light receiving surface 23*a*. Thus, the cross portion 34 can be formed by the first center grid electrode 31*a* and the linear electrode portion 33. Accordingly, it is possible to provide the cross portion 34 without greatly increasing the area of the grid electrodes.

In the module 1M (the units 20) of the present embodiment, the grid electrodes 31 of each solar cell 23 include a cross grid electrode forming the cross portion 34. Thus, as in the above, it is possible to perform accurate mutual alignment between the lens panel 13 (Fresnel lenses 13*f*) and its corresponding solar cells 23.

The module 1M (the units 20) of the present embodiment further includes the ball lenses 24 as the secondary condenser lenses, each ball lens 24 disposed between a Fresnel lens 13*f* and a solar cell 23 and configured to guide sunlight concentrated by the Fresnel lens 13*f* to the solar cell 23. Also in this case, based on the positional relation between the ball lens 24 and the cross portion 34 and the positional relation between the Fresnel lens 13*f* and the cross portion 34, it is possible to accurately adjust the position of the optical axis of each condenser lens to the center of its corresponding light receiving surface 23*a*. As a result, even when the ball lens 24 is provided, it is possible to perform accurate mutual alignment between each condenser lens and its corresponding solar cell 23.

In the present embodiment, each ball lens 24 is fixed to the solar cell 23 side so as to cover the light receiving surface 23*a* of the solar cell 23. Also in this case, the position of the cross portion 34 can be recognized through each condenser lens, and thus, it is possible to perform accurate mutual alignment between each condenser lens and its corresponding solar cell 23.

Also in the method for producing the module 1M of the present embodiment, the grid electrodes 31 of each solar cell 23 include a cross grid electrode forming the cross portion 34. Therefore, the center of the light receiving surface 23*a* can be easily recognized by means of the cross portion 34, and it is possible to perform accurate mutual alignment between the lens panel 13 and its corresponding solar cells 23.

4. MODIFICATIONS

Figure 11:
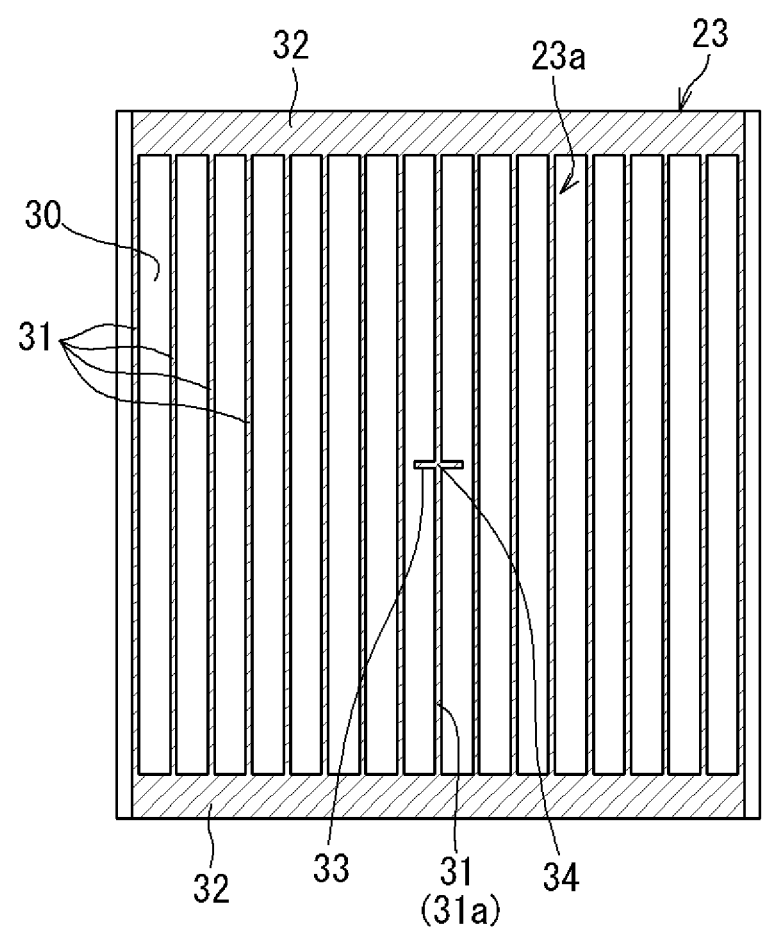
FIG. 11 shows a light receiving surface of a solar cell according to a modification and shows another aspect of a linear electrode portion.

FIG. 11 shows the light receiving surface 23*a* of the solar cell 23 according to a modification, and shows another aspect of the linear electrode portion 33.

In FIG. 11, the linear electrode portion 33 is in an open state where both ends thereof are not connected to other grid electrodes 31.

Also in the above case, the linear electrode portion 33 and the first center grid electrode 31*a* forms the cross portion 34 by crossing each other at the center of the light receiving surface 23*a*. Thus, it is possible to perform accurate mutual alignment between the condenser lens guiding sunlight to the light receiving surface 23*a* and its corresponding solar cell 23.

It should be noted that the length of the linear electrode portion 33 in the longitudinal direction thereof can be changed as appropriate as long as the linear electrode portion 33 crosses the first center grid electrode 31*a* at the center of the light receiving surface 23*a*.

In FIG. 4 and FIG. 11, cases have been described in which the linear electrode portion 33 is formed in parallel to the bus electrodes 32. However, it is sufficient that the linear electrode portion 33 crosses the first center grid electrode 31*a*. The linear electrode portion 33 may be provided so as to cross the first center grid electrode 31*a* at an angle other than 90 degrees, for example, at an angle of 45 degrees.

5. OTHERS

Figure 12A:
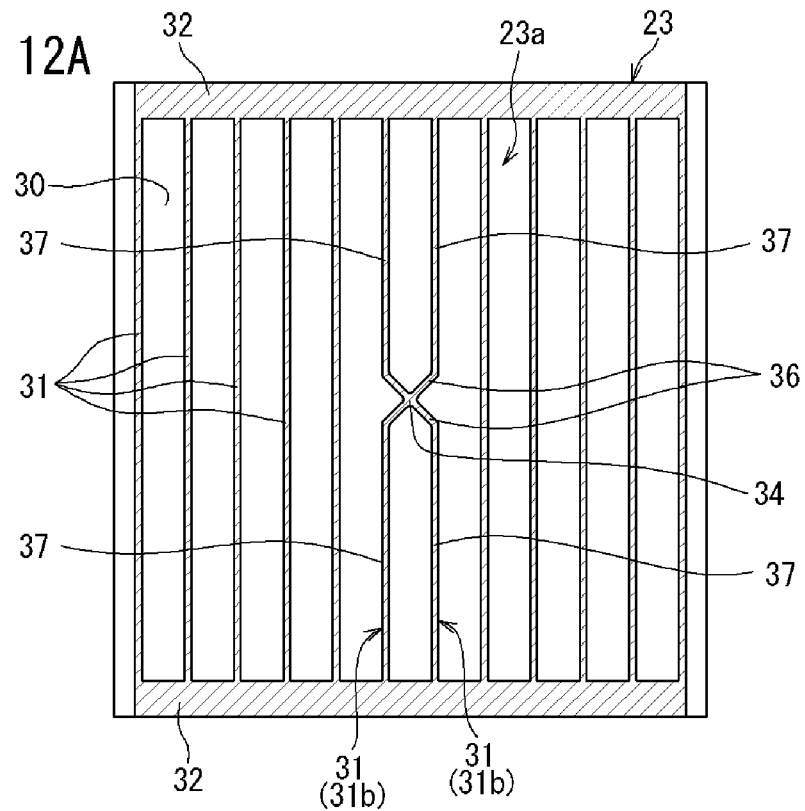
FIG. 12A shows a solar cell according to another embodiment, and shows a light receiving surface of the solar cell.
Figure 12B:
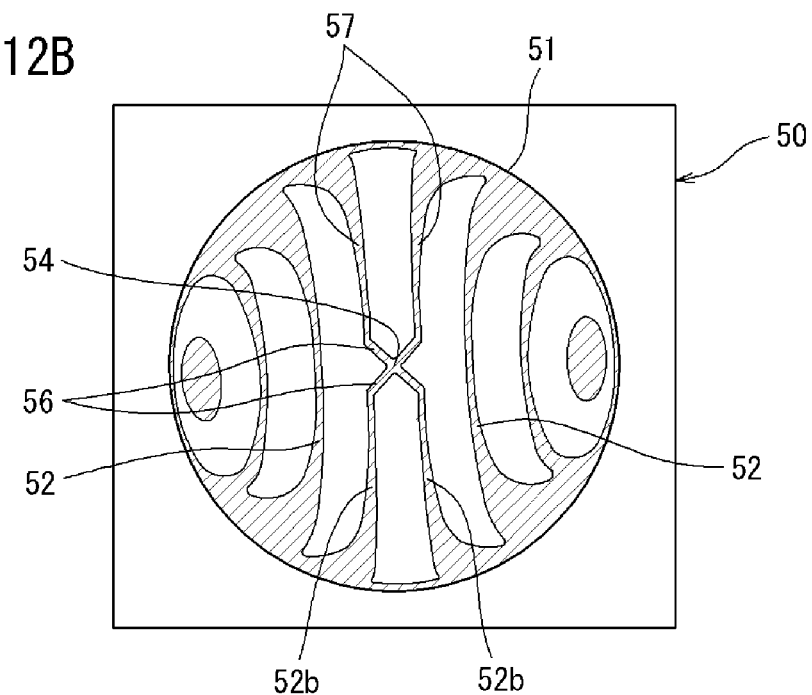
FIG. 12B shows one example of a captured image of the light receiving surface shown in FIG. 12A obtained by a camera part through a ball lens.
Figure 13A:
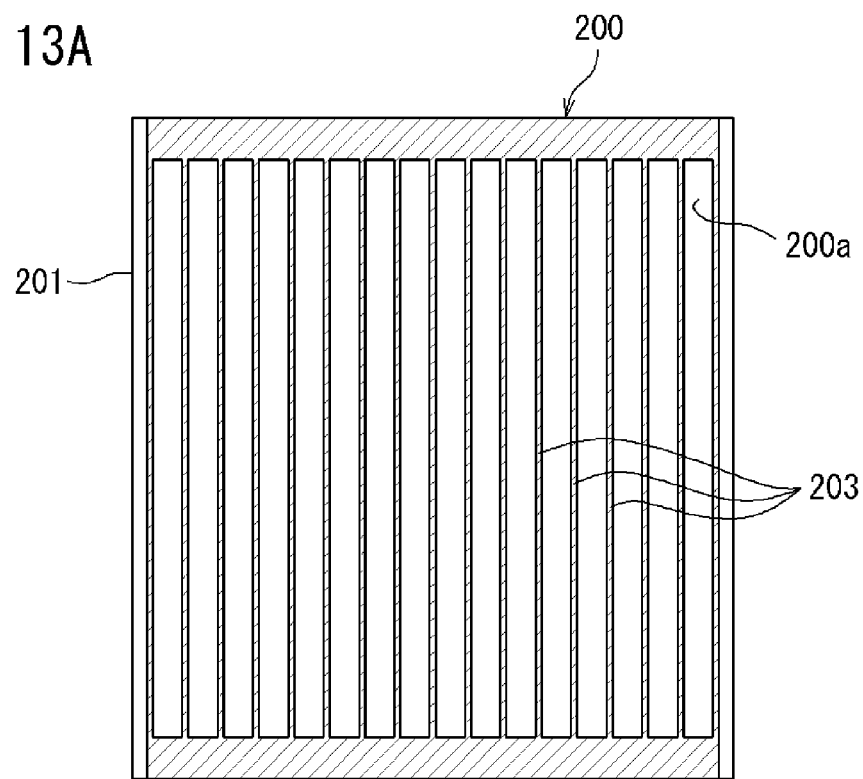
FIG. 13A shows a light receiving surface of a solar cell.
Figure 13B:
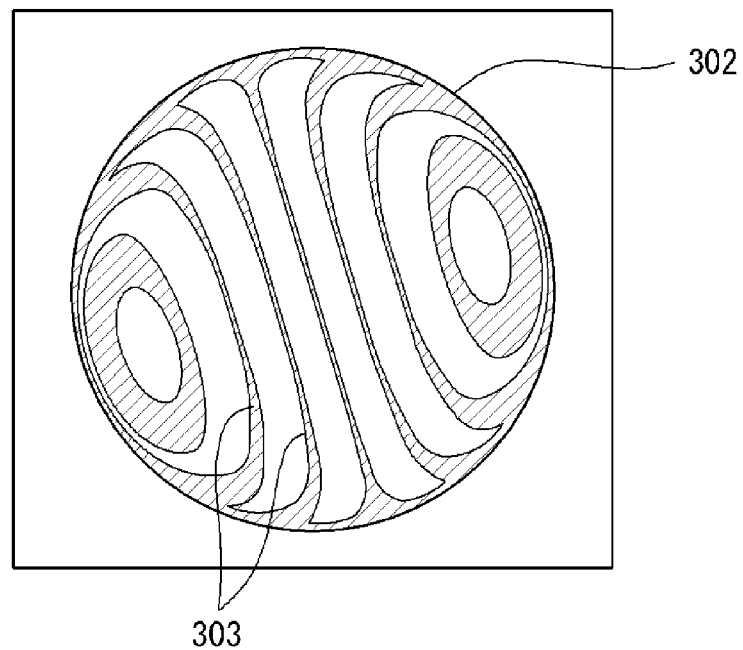
FIG. 13B shows one example of a captured image of a ball lens as a secondary condenser lens, when the ball lens is disposed immediately before the light receiving surface of the solar cell, the image captured by a camera or the like from the irradiation direction in which the ball lens is irradiated with sunlight.

FIG. 12A shows the solar cell 23 according to another embodiment, and shows the light receiving surface 23*a* of the solar cell 23. FIG. 12B shows one example of a captured image of the light receiving surface shown in FIG. 12A obtained by a camera part through the ball lens 24.

The present embodiment is different from the above embodiment in that a pair of second center grid electrodes 31*b* passing the center of the light receiving surface 23*a* are provided.

In FIG. 12A, the pair of second center grid electrodes 31*b* are arrayed in the center portion in the width direction of the light receiving surface 23*a*, and the second center grid electrodes 31*b* each pass the center of the light receiving surface 23*a*, thereby forming a cross grid electrode.

The pair of second center grid electrodes 31*b* include: oblique electrode portions 36 forming the cross portion 34 by extending in directions that cross other grid electrodes 31 and by crossing each other; and parallel electrode portions 37 each extending in parallel to the other grid electrodes 31, from both ends of a corresponding one of the oblique electrode portions 36 toward edge sides of the light receiving surface 23*a* where the bus electrodes 32 are respectively provided.

As shown in FIG. 12B, also in this case, image portions 52*b* of the pair of second center grid electrodes 31*b* passing the center of the light receiving surface 23*a* appear in the center portion of the image portion 51 of the ball lens 24. In FIG. 12B, the portions with hatching indicate the image portions 52 of the grid electrodes 31 (the image portions 52*b* of the second center grid electrodes 31*b*).

Further, in the center portion of the image portion 51 of the ball lens 24, there appear image portions 56 of the oblique electrode portions 36, and image portions 57 of the parallel electrode portions 37 forming the pair of second center grid electrodes 31*b*, and further, the image portion 54 of the cross portion 34.

Thus, also in the present embodiment, as in the above embodiment, it is possible to accurately dispose the ball lens 24 on the optical axis S.

In the light receiving surface 23*a* of the solar cell 23 shown in FIG. 4, there exists the first center grid electrode 31*a* extending in parallel to the other grid electrodes 31 and passing the center of the light receiving surface 23*a*. By use of this first center grid electrode 31*a*, the cross portion 34 is formed without increasing the area of the grid electrodes as much as possible.

On the other hand, as shown in FIG. 12A, in a case where the first center grid electrode 31*a* extending in parallel to the other grid electrodes 31 and passing the center of the light receiving surface 23*a* does not exist, if the pair of second center grid electrodes 31*b* including the oblique electrode portions 36 and the parallel electrode portions 37 are arrayed in the center portion in the width direction of the light receiving surface 23*a* as in the present embodiment, it is possible to provide the cross portion 34.

As described above, in the present embodiment, even when the first center grid electrode 31*a* extending in parallel to the other grid electrodes 31 and passing the center of the light receiving surface 23*a* does not exist, the cross portion 34 can be formed by the pair of second center grid electrodes 31b including the oblique electrode portions 36. Accordingly, it is possible to provide the cross portion 34 without greatly increasing the area of the grid electrodes.

6. CONCLUSION

The embodiments disclosed herein are to be considered in all respects as illustrative and not restrictive. The scope of the present invention is indicated by the appended claims rather than by the foregoing meaning, and all changes that come within the meaning and range of equivalency of the claims are therefore intended to be embraced therein.

REFERENCE SIGNS LIST 1 concentrator photovoltaic panel
1M concentrator photovoltaic module
2 post
3 base
11 housing
11a bottom surface
11c opening
12 flexible printed circuit
13 lens panel
13f Fresnel lens
13f1 incident surface
13f2 base material
13f3 silicone resin film
13g center region
13h concentration region
14 connector
15 wall part
15a end surface
16 flexible substrate
20 unit
21 power generating element part
22 resin frame
23 solar cell
23a light receiving surface
24 ball lens
24a incident surface
25 resin
30 semiconductor substrate
31 grid electrode
31a first center grid electrode
31b second center grid electrode
32 bus electrode
33 linear electrode portion
34 cross portion
36 oblique electrode portion
37 parallel electrode portion
40 ball lens mounting device
41 positional adjustment section
42 controller
43 camera part
44 holder
44a holding hole
45 drive unit
50 captured image
51 image portion of ball lens
52 image portion of grid electrode
52a image portion of first center grid electrode
52b image portion of second center grid electrode
53 image portion of linear electrode portion
54 image portion of cross portion
56 image portion of oblique electrode portion
57 image portion of parallel electrode portion
60 to 63 camera
65 control device
66 position adjuster
100 concentrator photovoltaic apparatus

The invention claimed is:

1. A solar cell in which a plurality of grid electrodes each formed in a linear shape are arrayed on a light receiving surface of the solar cell, wherein
the plurality of grid electrodes include:
a pair of first grid electrodes formed straight across the light receiving surface, the pair of first grid electrodes being arranged in parallel and arranged on both sides of a center of the light receiving surface, and
a pair of cross grid electrodes forming a cross portion exhibiting a center-specific geometry caused by the pair of cross grid electrodes crossing each other at a center of the light receiving surface, the pair of cross grid electrodes formed entirely in an area between the pair of first grid electrodes, and
second grid electrodes, extending in parallel to the pair of first grid electrodes and arrayed outside the area, the second grid electrodes being all grid electrodes of the plurality of grid electrodes excluding the pair of first grid electrodes and the pair of cross electrodes.

2. The solar cell according to claim 1, wherein
the pair of cross grid electrodes includes:
a center grid electrode extending in parallel to the pair of first grid electrodes and passing the center of the light receiving surface, and
a linear electrode crossing the center grid electrode at the center of the light receiving surface, the linear electrode being shorter than the center grid electrode.

3. The solar cell according to claim 2, wherein
the linear electrode has both ends thereof respectively connected to the pair of first grid electrodes.

4. The solar cell according to claim 1, wherein
the pair of cross grid electrodes include: oblique electrode portions extending in directions that cross the pair of first grid electrodes; and parallel electrode portions each extending in parallel to the pair of first grid electrodes, from both ends of a corresponding one of the oblique electrode portions toward edge sides of the light receiving surface, and
the oblique electrode portions cross each other to form the cross portion.

5. A concentrator photovoltaic unit comprising:
a solar cell in which a plurality of grid electrodes each formed in a linear shape are arrayed on a light receiving surface of the solar cell; and
a condenser lens configured to concentrate sunlight on the solar cell, wherein
the plurality of grid electrodes include:
a pair of first grid electrodes formed straight across the light receiving surface, the pair of first grid electrodes being arranged in parallel and arranged on both sides of a center of the light receiving surface, and
a pair of cross grid electrodes forming a cross portion exhibiting a center-specific geometry caused by the pair of cross grid electrodes crossing each other at a center of the light receiving surface, the pair of cross grid electrodes formed entirely in an area between the pair of first grid electrodes, and
second grid electrodes, extending in parallel to the pair of first grid electrodes and arrayed outside the area, the second grid electrodes being all grid electrodes of the plurality of grid electrodes excluding the pair of first grid electrodes and the pair of cross electrodes.

6. The concentrator photovoltaic unit according to claim 5, further comprising
a secondary condenser lens disposed between the condenser lens and the solar cell and configured to guide sunlight concentrated by the condenser lens to the solar cell.

7. The concentrator photovoltaic unit according to claim 6, wherein
the secondary condenser lens is a ball lens and is fixed to the solar cell side so as to cover the light receiving surface of the solar cell.

8. A concentrator photovoltaic module comprising:
a plurality of solar cells provided in a form of an array; and
a concentrating member in which a plurality of condenser lenses each concentrating sunlight incident on an incident surface thereof are formed at positions corresponding to the solar cells on optical axes thereof, wherein
on a light receiving surface of each solar cell, a plurality of grid electrodes each formed in a linear shape are arrayed, and the plurality of grid electrodes include:
a pair of first grid electrodes formed straight across the light receiving surface, the pair of first grid electrodes being arranged in parallel and arranged on both sides of a center of the light receiving surface, and
a pair of cross grid electrodes forming a cross portion exhibiting a center-specific geometry caused by the pair of cross grid electrodes crossing each other at a center of the light receiving surface, the pair of cross grid electrodes formed entirely in an area between the pair of first grid electrodes, and
second grid electrodes, extending in parallel to the pair of first grid electrodes and arrayed outside the area, the second grid electrodes being all grid electrodes of the plurality of grid electrodes excluding the pair of first grid electrodes and the pair of cross electrodes.

* * * * *